(12) United States Patent
Miwa et al.

(10) Patent No.: US 10,381,530 B2
(45) Date of Patent: Aug. 13, 2019

(54) LIGHT EMITTING DEVICE

(71) Applicant: TOYODA GOSEI CO., LTD., Kiyosu-shi (JP)

(72) Inventors: Tomohiro Miwa, Kiyosu (JP); Shota Shimonishi, Kiyosu (JP); Satomi Seki, Kiyosu (JP); Daisuke Kato, Kiyosu (JP); Shigeo Takeda, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 74 days.

(21) Appl. No.: 15/820,180

(22) Filed: Nov. 21, 2017

(65) Prior Publication Data

US 2018/0261733 A1    Sep. 13, 2018

(30) Foreign Application Priority Data

Mar. 7, 2017 (JP) .................................. 2017-043303

(51) Int. Cl.
*H01L 33/50* (2010.01)
*H01S 5/022* (2006.01)

(52) U.S. Cl.
CPC .......... *H01L 33/504* (2013.01); *H01L 33/502* (2013.01); *H01L 33/507* (2013.01); *H01S 5/02276* (2013.01); *H01S 5/02228* (2013.01)

(58) Field of Classification Search
CPC ... H01L 33/504; H01L 33/502; H01L 33/507; H01L 33/50; H01L 33/501; H01L 33/508; H01S 5/02276; H01S 5/02228; F21V 9/00; F21V 9/02; F21V 9/30; F21V 9/32; F21V 9/38; F21K 9/64
See application file for complete search history.

(56) References Cited

U.S. PATENT DOCUMENTS

| 2010/0193806 A1* | 8/2010 | Byun | H01L 33/507 |
| | | | 257/88 |
| 2010/0258828 A1* | 10/2010 | Ramer | H01L 33/502 |
| | | | 257/98 |
| 2012/0187824 A1* | 7/2012 | Yamakawa | C09K 11/665 |
| | | | 313/503 |
| 2017/0200869 A1* | 7/2017 | Lange | H01L 33/504 |

FOREIGN PATENT DOCUMENTS

| JP | 2016-111190 A | 6/2016 |
| JP | 2016-157965 A | 9/2016 |

* cited by examiner

*Primary Examiner* — Bao Q Truong
(74) *Attorney, Agent, or Firm* — McGinn IP Law Group, PLLC.

(57) ABSTRACT

A light emitting device includes a light emitting element that emits a light having a peak wavelength of not less than 411 nm and not more than 421 nm, and a phosphor that emits a fluorescence having a longer peak wavelength than the peak wavelength of the light emitted from the light emitting element. An emission spectrum of only the light emitting element and an emission spectrum of only the phosphor overlap each other while having an overlap width of not less than 71 nm and not more than 81 nm. The overlap width is defined as a wavelength difference between a long wavelength side point at a 0.1% height of a peak height of the emission spectrum of only the light emitting element and a short wavelength side point at a 0.1% height of a highest peak of the emission spectrum of only the phosphor.

12 Claims, 4 Drawing Sheets

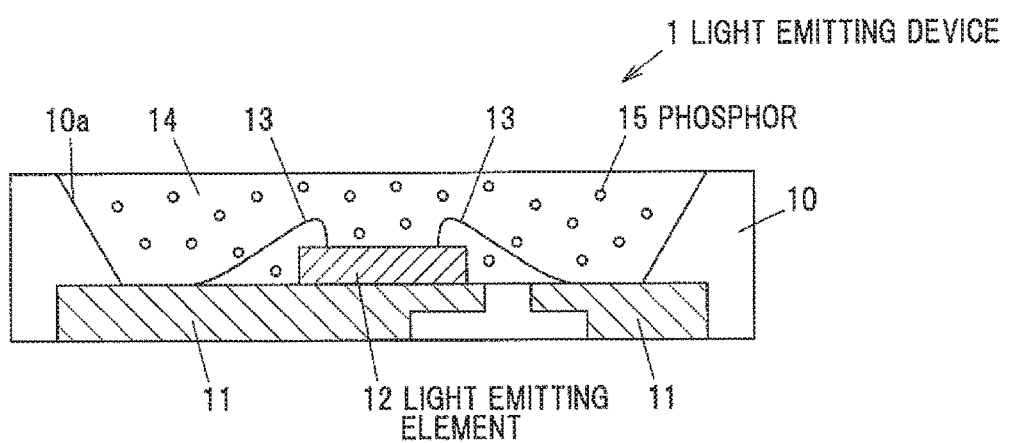

LIGHT EMITTING DEVICE

The present application is based on Japanese patent application No. 2017-043303 filed on Mar. 7, 2017, the entire contents of which are incorporated herein by reference.

BACKGROUND OF THE INVENTION

1. Field of the Invention

This invention relates to a light emitting device.

2. Description of the Related Art

A light emitting device is known that is provided with a light emitting element having a peak emission wavelength ranging 400 nm to 460 nm and a phosphor, and emits a mixed light of light emitted from the light emitting element and fluorescence emitted from the phosphor. The emitted light is not less than 85 in general color rendering index Ra and not less than 50 in special color rendering index R9 (red) (see e.g. JP 2016/111190A).

Also, a light emitting device is known that is provided with a light emitting element having a peak emission wavelength ranging a near-ultraviolet to a blue region and a phosphor. The emitted light is 90 to 97 in general color rendering index Ra (see e.g. JP 2016/157965A).

Meanwhile, the general color rendering index Ra and the special color rendering index R9 are parameters for evaluating by quantification the color rendering property thereof. It is deemed that according as the parameters of light come close to 100, the light will come close to a reference light such as the sunlight.

SUMMARY OF THE INVENTION

It is an object to provide a light emitting device that is excellent in color rendering properties so as to emit a light closer to the sunlight than the known light emitting device.

According to an embodiment of the invention, a light emitting device defined by [1] to [6] below is provided.

[1] A light emitting device, comprising:
a light emitting element that emits a light having a peak wavelength of not less than 411 nm and not more than 421 nm; and
a phosphor that emits a fluorescence having a longer peak wavelength than the peak wavelength of the light emitted from the light emitting element,
wherein an emission spectrum of only the light emitting element and an emission spectrum of only the phosphor overlap each other while having an overlap width (or overlap margin) of not less than 71 nm and not more than 81 nm, and
wherein the overlap width (or overlap margin) is defined as a wavelength difference between a long wavelength side point at a 0.1% height of a peak height of the emission spectrum of only the light emitting element and a short wavelength side point at a 0.1% height of a highest peak of the emission spectrum of only the phosphor.

[2] The light emitting device according to [1], wherein the overlap width (or overlap margin) is not less than 71 nm and not more than 79 nm.

[3] The light emitting device according to [1], wherein the overlap width (or overlap margin) is not less than 73 nm and not more than 75 nm.

[4] The light emitting device according to any one of [1] to [3], wherein the light emitting device emits a light satisfying $Rf \geq 90$ and $95 \leq Rg \leq 105$, where Rf and Rg are color rendering indexes when a reference light is defined as a light with a color temperature of not less than 5000K and not more than 6500K.

[5] The light emitting device according to any one of [1] to [4], wherein the phosphor comprises a first phosphor emitting a fluorescence having a peak emission wavelength of not less than 445 nm and not more than 490 nm, a second phosphor emitting a fluorescence having a peak emission wavelength of not less than 491 nm and not more than 600 nm, and a third phosphor emitting a fluorescence having a peak emission wavelength of not less than 601 nm and not more than 670 nm.

[6] The light emitting device according to [5], wherein the first phosphor comprises two types of alkaline earth halophosphate phosphors,
wherein the second phosphor comprises a β-SiAlON phosphor and a Ca solid solution α-SiAlON phosphor, and
wherein the third phosphor comprises a CASON phosphor and a CASN phosphor.

Effects of the Invention

According to an embodiment of the invention, a light emitting device can be provided that is excellent in color rendering properties so as to emit a light closer to the sunlight than the known light emitting device.

BRIEF DESCRIPTION OF THE DRAWINGS

Next, the present invention will be explained in conjunction with appended drawings, wherein:

FIG. 1 is a cross sectional view showing a light emitting device 1 according to the embodiment;

DETAILED DESCRIPTION OF THE PREFERRED EMBODIMENTS

Figure 2A:
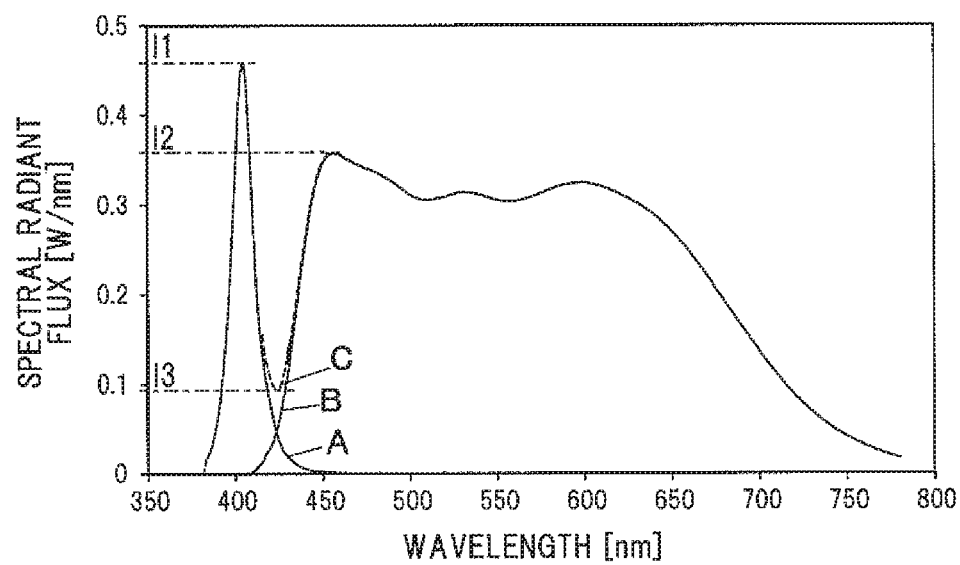
FIG. 2A is a graph chart showing emission spectrum only of a light emitting element, emission spectrum only of a phosphor, and a spectrum of a mixed light.

Embodiments (Structure of a Light Emitting Device)

FIG. 1 is a vertical cross sectional view showing a light emitting device 1 according to the embodiment. The light emitting device 1 is provided with a case 10 having a recessed portion 10*a*, a lead frame 11 located in the case 10 so as to be exposed at a bottom of the recessed portion 10*a*, a light emitting element 12 mounted on the lead frame 11, bonding wire 13 electrically connecting the lead frame 11 and an electrode of the light emitting element 12, sealing resin 14 filled in the recessed portion 10a and sealing the light emitting element 12, and a particle phosphor 15 included in the sealing resin 14.

For example, the case 10 comprises heat plasticity resins such as polyphthalamide resin, Liquid Crystal Polymer (LCP), and Polycyclohexylene Dimethylene Terephalate (PCT), and thermoset resins such as silicone resin, modified silicone resin, epoxy resin, and modified epoxy resin. The case 10 is formed by injection molding or transfer molding. The case 10 may comprise a light reflective particle such as titanium dioxide so as to improve optical reflectance.

For example, the whole or surface of the lead frame 11 comprises conductive materials such as Ag, Cu, and Al.

Typically, the light emitting element 12 is a light emitting diode (LED) element or a laser diode element. As shown in the example in FIG. 1, the light emitting element 12 is a face-up type element connected to the lead frame 11 by the bonding wire 13. Meanwhile, the light emitting element 12 may be a face-down type element and may be connected to the lead frame using a connecting member such as a conductive bump in addition to the bonding wire.

An emission intensity in a short wavelength region (the violet wavelength region) in the emission spectrum of the light emitting device 1 decreases caused by too long peak emission wavelength of the light emitted from the light emitting element 12. Thus, it is difficult to bring the emission spectrum of the light of the emitting device 1 close to the emission spectrum of the sunlight. Therefore, the peak emission wavelength of the light emitted from the light emitting element 12 is desirably not more than 421 nm.

Meanwhile, a spectrum trough between a peak of the emission spectrum of the emitting element 12 and a peak of an emission spectrum of the phosphor 15 becomes deeper caused by too short peak emission wavelength of the light emitted from the light emitting element 12. Thus, it is difficult to bring the emission spectrum of the light emitting device 1 close to the emission spectrum of the sunlight. Therefore, the peak emission wavelength of the light emitted from the light emitting element 12 is desirably not less than 411 nm.

For example, the sealing resin 14 comprises resin material such as the silicone resin or the epoxy resin.

The phosphor 15 emits the fluorescence by the light emitted from the light emitting element 12 as an excitation source. The phosphor 15 is provided with a phosphor having a peak at a longer wavelength side from the peak emission wavelength of the light emitted from the light emitting element 12. The phosphor 15 is desirably provided with various types of the phosphors emitting the fluorescence having different wavelength range so as to improve a color rendering property of the light emitted from the light emitting device 1.

For example, the phosphor 15 is desirably provided with a blue phosphor that emits the fluorescence having the peak emission wavelength of not less than 445 nm and not more than 490 nm, a yellow-green phosphor that emits the fluorescence having the peak emission wavelength of not less than 491 nm and not more than 600 nm, and a red phosphor that emits the fluorescence having the peak emission wavelength of not less than 601 nm and not more than 670 nm.

For example, alkaline earth halophosphate phosphor can be used as the blue phosphor that emits the fluorescence having the peak emission wavelength of not less than 445 nm and not more than 490 nm. Main component of alkaline earth halophosphate phosphor will be shown in Table 1 described below.

TABLE 1

| Phosphor | Main component |
| --- | --- |
| Alkaline earth halophosphate phosphor | $(Ba,Sr,Ca,Mg)_5(PO_4)_3Cl:Eu^{2+}$ |
|  | $(Ba,Sr,Ca,Mg)_{10}(PO_4)_6Cl_2:Eu^{2+}$ |

Alkaline earth halophosphate phosphor can change the emission spectrum by changing concentrations of an activator agent such as Eu or alkaline earth metals such as Ca, Sr, Ba, and Mg.

For example, Ca solid solution α-SiAlON phosphor, β-SiAlON phosphor, Silicate phosphor, Nitride phosphor, LSN phosphor, YAG phosphor, or LuAG phosphor can be used as the yellow-green phosphor that emits the fluorescence having the peak emission wavelength of not less than 491 nm and not more than 600 nm. Main components of these phosphors will be shown in Table 2 described below.

TABLE 2

| Phosphor | Main Component |
| --- | --- |
| Ca solid solution α-SiAlON phosphor | $Ca—Si_{12-(m+n)}Al_{m+n}O_nN_{16-n}$ |
| β-SiAlON phosphor | $Si_{6-z}Al_zO_zN_{8-z}:Eu^{2+}$ |
| Silicate phosphor | $(Ca,Sr,Ba)_3SiO_5:Eu^{2+}$ |
|  | $(Ba,Sr,Ca)_2SiO_4:Eu^{2+}$ |
| Nitride phosphor | $(Ca,Sr,Ba)_2Si_5N_8:Eu^{2+}$ |
| LSN phosphor | $(La,Ca)_3Si_6N_{11}:Ce^{3+}$ |
| YAG phosphor | $(Y,Gd)_3(Al,Ga)_5O_{12}:Ce^{3+}$ |
| LuAG phosphor | $Lu_3(Al,Ga)_5O_{12}:Ce^{3+}$ |

YAG phosphor, LuAG phosphor can change the emission spectrum by changing concentrations of Gd, Ga, and the activator agent such as Ce.

For example, CASN phosphor, SCASN phosphor, or CASON phosphor can be used as the red phosphor that emits the fluorescence having the peak emission wavelength of not less than 601 nm and not more than 670 nm. Main components of these phosphors will be shown in Table 3 described below.

TABLE 3

| Phosphor | Main Component |
| --- | --- |
| CASN phosphor | $CaAlSiN_3:Eu^{2+}$ |
| SCASN phosphor | $(Sr,Ca)AlSiN_3:Eu^{2+}$ |
| CASON phosphor | $Ca_{1-x}Al_{1-x}Si_{1+x}N_{3-x}O_x:Eu^{2+}$ |

CASN phosphor, SCASN phosphor, and CASON phosphor can change the emission spectrum by changing concentrations of the activator agent such as Eu, or alkaline earth metal such as Ca and Sr.

Combinations and ratio of concentration of the phosphors included in the phosphor 15 are adjusted such that the emission spectrum of the light emitting device 1 comes close to the emission spectrum of the sunlight. For example, the combinations and the ratio of concentration of the phosphors included in the phosphor 15 are adjusted such that color rendering indexes Rf, Rg come close to 100 while the sunlight in the morning whose color temperature is not less than 5000K and not more than 6500K is defined as a reference light.

As described below, in the light emitting element 1, the emission spectra only of the light emitting element 12 and only of the phosphor 15 are overlapped each other while having an overlap width of not less than 71 nm and not more than 81 nm. The combinations and the ratio of concentration of the phosphors included in the phosphor 15 are desirably adjusted such that the color rendering indexes Rf, Rg of the light emitted from the light emitting device 1 satisfies Rf≥97 and 99≤Rg≤102 while the light whose color temperature is not less than 5000K and not more than 6500K is defined as the reference light.

The above color rendering indexes Rf, Rg are used in a new light color rendering property evaluation method "TM-30-15" defined by the Illuminating Engineering Society of North America (IES).

The Rf is a parameter indicating color fidelity. The Rf can evaluate the color fidelity in higher accuracy than the general color rendering index Ra used in the color rendering index (CRI) defined by International Commission on Illumination (CIE) since the Rf can be evaluated from 99 types of color tests. The maximum of the Rf is defined as 100. It is assumed that according as the color of the test light comes close to 100, the light comes close to the reference light such as the sunlight.

The Rg is a parameter indicating color brightness that is not evaluated in the known evaluation method. It is assumed that as the Rg comes close to 100, the color brightness of the test light comes close to the color brightness of the reference light such as the sunlight. The Rg may be less than 100 or more than 100.

The emission spectra only of the light emitting element 12 and only of the phosphor 15 are overlapped each other while having the overlap width of not less than 71 nm and not more than 81 nm. The overlap width means the difference in the wavelength between a longer wavelength side point of two points of 0.1% of a peak height in the emission spectrum only of the light emitting element 12, and a shorter wavelength side point of two points of 0.1% of the highest peak height in the emission spectrum only of the phosphor 15.

The overlap width is defined as described above so as to prevent from causing an effect by background noise, not defined as a different in the wavelength between a longer wavelength side zero point of the emission spectrum only of the light emitting element 12 and a shorter wavelength side zero point of the emission spectrum only of the phosphor 15.

The light emitting element absorbs the fluorescence emitted from the phosphor by closing the wavelength regions of the emission spectrum of the light emitting element and the emission spectrum of the phosphor. Thus, the wavelength region of the emission spectrum of the light emitting element is normally partially separated from the wavelength region of the emission spectrum of the phosphor. However, this embodiment brings the wavelength region of the emission spectrum of the light emitting element 12 close to the wavelength region of the emission spectrum of the phosphor 15 on purpose by the overlap width not less than 71 nm and not more than 81 nm so as to improve the color rendering property.

For example, a mixture ratio of the blue phosphor easily absorbing the fluorescence (for example, the phosphor emitting the fluorescence having the peak emission wavelength of not less than 445 nm and not more than 490 nm) in the phosphor 15 can increase while considering the change in the emission spectrum by the light emitting element 12 absorbing the fluorescence emitted from the phosphor 15.

FIG. 2A is a graph chart showing an emission spectrum A only of a light emitting element 12, an emission spectrum B only of the phosphor 15, and a spectrum of a mixed light of the light emitted from the light emitting element 12 and the fluorescence emitted from the phosphor 15.

The light emitting element 12 according to FIG. 2A emits the light having the peak emission wavelength of 405 nm. The phosphor 15 is provided with two types of Alkaline earth halophosphate phosphors having different components, Ca solid solution α-SiAlON phosphor, β-SiAlON phosphor, CASON phosphor, and CASN phosphor.

As shown in FIG. 2A, I1 is defined as a height at the peak emission wavelength of the light emitted from the light emitting element 12, I2 is defined as a height at the shortest peak emission wavelength in the fluorescence emitted from the phosphor 15, and I3 is defined as a height of the trough defined between the peak emission wavelength of the light emitted from the light emitting element 12 and the shortest peak emission wavelength in the fluorescence emitted from the phosphor 15.

As I1/I3 that is the ratio of I1 to I3, and I2/I3 that is the ratio of I2 to I3 are smaller, the trough defined between the peak emission wavelength of the light emitted from the light emitting element 12 and the shortest peak emission wavelength in the fluorescence emitted from the phosphor 15 becomes shallow in the spectrum of the mixed light of the light emitted from the light emitting element 12 and the fluorescence emitted from the phosphor 15.

Figure 2B:
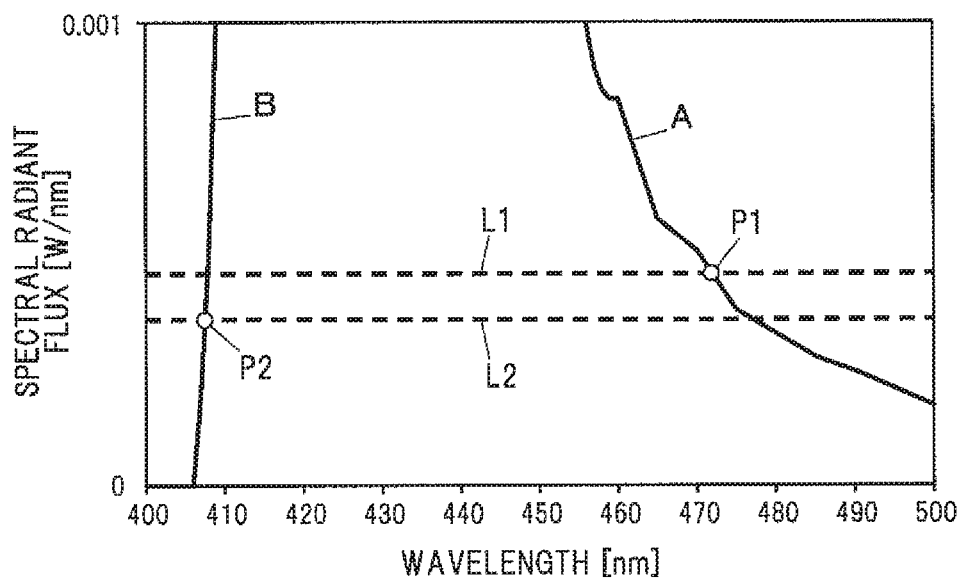
FIG. 2B is an enlarged view of the graph chart showing an overlap width between emission spectrum only of the light emitting element and emission spectrum only of the phosphor.

FIG. 2B is an enlarged view of the graph chart showing the overlap width between the emission spectrum A only of the light emitting element 15 and the emission spectrum B only of the phosphor 15.

The point P1 shown in FIG. 2B is the longer wavelength side point of two points of 0.1% of the peak height I1 in the emission spectrum A only of the light emitting element 12 (the dot-line L1). The wavelength at the point P1 is 475 nm.

The point P2 shown in FIG. 2B is the shorter wavelength side point of two points of 0.1% of the highest peak height I2 in the emission spectrum B only of the phosphor 15 (the dot-line L2). The wavelength at the point P2 is 407 nm.

Thus, the overlap width between the emission spectrum A only of the light emitting element 12 and the emission spectrum B only of the phosphor 15 shown in FIGS. 2A, 2B is 65 nm.

Meanwhile, the structure of the light emitting element is not limited to the structure shown in FIG. 1 as long as the structure is provided with the light emitting element 12 and the phosphor 15.

Advantageous Effect of the Embodiment

According to the above embodiment, a light emitting device that is excellent in color rendering property so as to emit a light closer to the sunlight than the light emitted from the known light emitting device can be provided.

EXAMPLES

Results of simulations so as to define the structure of the light emitting device 1 having excellent color rendering property will be described below. Each color rendering index in the example is a parameter defined in the light having the color temperature of 5000K to 6500K as the reference light.

The phosphor 15 is arranged that is provided with two types of Alkaline earth halophosphate phosphors having different components, Ca solid solution α-SiAlON phosphor, β-SiAlON phosphor, CASON phosphor, and CASN phosphor. The table 4 shows compounding ratio (ratio of mass) of the phosphors included in the phosphor 15. The total compounding ratio of each phosphor is defined so as to be 100 percent by mass.

TABLE 4

| | Compound Ratio (percent by mass) |
|---|---|
| Alkaline earth halophosphate phosphor | 5 to 30 |
| Alkaline earth halophosphate phosphor | 50 to 80 |
| Ca solid solution α-SiAlON phosphor | 1 to 10 |
| β-SiAlON phosphor | 0.5 to 10 |
| CASON phosphor | 1 to 20 |
| CASN phosphor | 0.1 to 5 |

The emission spectrum of the light emitting element 12 emitting the light having the peak emission wavelength of 385 nm and the emission spectrum of the phosphor 15 are respectively calculated.

The overlap width between the emission spectrum of the light emitting element 12 and the emission spectrum of the phosphor 15 changes by shifting the emission spectrum of the light emitting element 12 obtained by calculating in the peak emission spectrum ranging 395 nm to 430 nm. Then, the color rendering indexes R1 to R8, the general color rendering index Ra that is the average of the indexes R1 to R8, and the special color rendering indexes R9 to R15, the color rendering indexes Rfh,1 to Rfh,16, Rf, and Rg, the Correlated Color Temperature (CCT), and the chromaticity coordinates Cx, Cy of the light emitted from the light emitting device 1, which is the mixed light of the light emitted from the light emitting element 12 and the fluorescence emitted from the phosphor 15, are calculated.

The color rendering indexes R1 to R8, the general color rendering index Ra, and the special color rendering indexes R9 to R14 are defined by CIE and Japan Industrial Standards (JIS). The special color rendering index R15 is defined by JIS. The color rendering indexes Rfh,1 to Rfh,16, Rf, and Rg are defined by IES. The chromaticity coordinates Cx, Cy are defined by CIE.

Figure 3A:
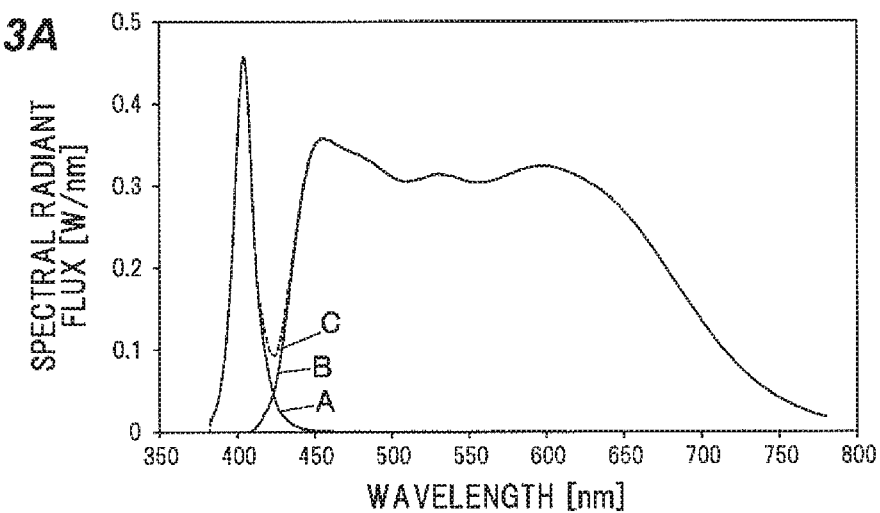
FIG. 3A is a graph chart showing an emission spectrum of the light emitting element having a peak emission wavelength of 405 nm.
Figure 3B:
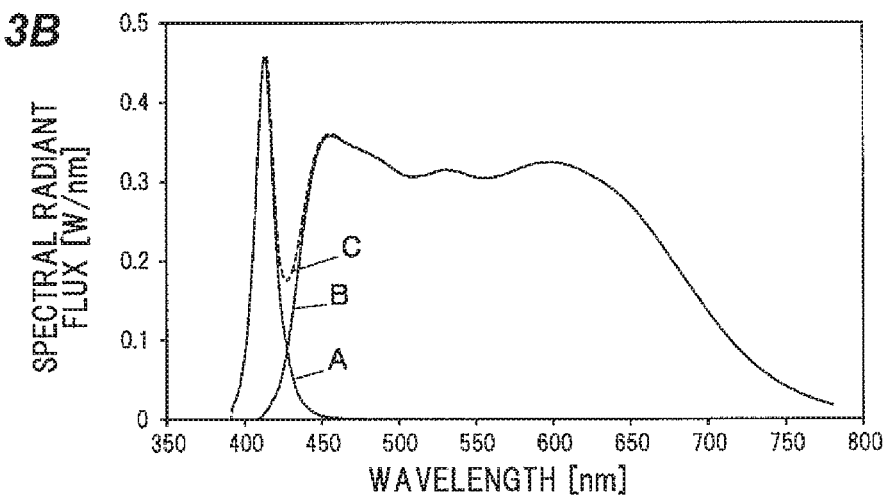
FIG. 3B is the graph chart showing the emission spectrum of the light emitting element having the peak emission wavelength of 414 nm.
Figure 3C:
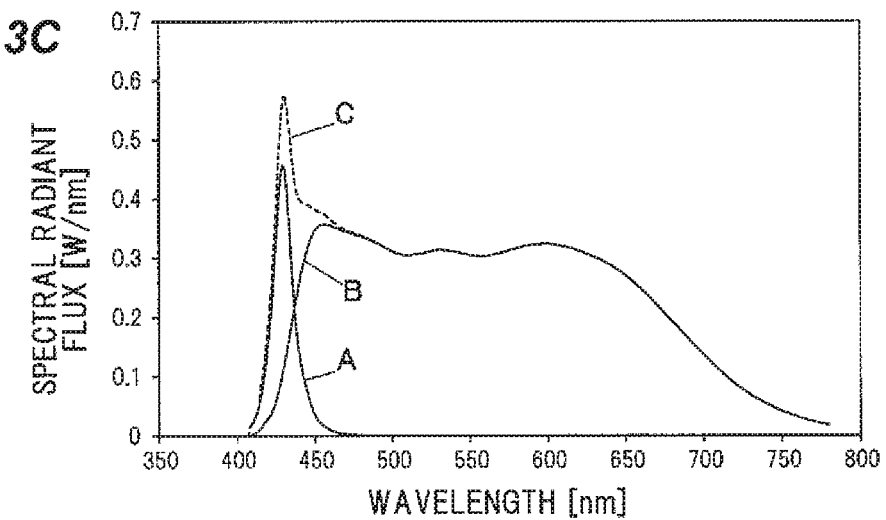
FIG. 3C is the graph chart showing the emission spectrum of the light emitting element having the peak emission wavelength of 430 nm.

As the examples, FIG. 3A is a graph chart showing an emission spectrum of the light emitting element 12 having the peak emission wavelength of 405 nm, FIG. 3B is the graph chart showing the emission spectrum of the light emitting element 12 having the peak emission wavelength of 414 nm, and FIG. 3C is the graph chart showing the emission spectrum of the light emitting element 12 having the peak emission wavelength of 430 nm.

Tables 5, 6 show the overlap widths between the emission spectrum of the light emitting element 12 and the emission spectrum of the phosphor 15 by the peak emission wavelength of the the light emitting element 12, which is calculated by simulation. And Tables 5, 6 shows the color rendering indexes Rf, Rg, Rfh,1 to Rfh, 16 for the emission spectrum of the mixed light, and ratios of the spectral radiant flux I1/I3, and I2/I3, which are calculated by the simulation.

"The wavelength" in Tables 5, 6 means the peak emission wavelength of the light emitting element 12, and "N/A" means that the emission spectrum does not include the emission spectrum of the light emitting element 12 and only includes the emission spectrum of the phosphor 15.

TABLE 5

| Wavelength | N/A | 385 nm | 395 nm | 405 nm | 410 nm | 411 nm | 412 nm | 413 nm | 414 nm | 415 nm |
|---|---|---|---|---|---|---|---|---|---|---|
| Overlap width | — | 45 | 55 | 65 | 70 | 71 | 72 | 73 | 74 | 75 |
| Rf | 90 | 91 | 91 | 94 | 96 | 97 | 97 | 97 | 97 | 97 |
| Rg | 97 | 97 | 97 | 98 | 99 | 99 | 99 | 100 | 100 | 100 |
| Rfh, 1 | 91 | 92 | 92 | 94 | 96 | 96 | 96 | 96 | 96 | 96 |
| Rfh, 2 | 97 | 97 | 97 | 98 | 98 | 98 | 97 | 97 | 97 | 97 |
| Rfh, 3 | 94 | 95 | 95 | 97 | 98 | 98 | 98 | 98 | 98 | 98 |
| Rfh, 4 | 89 | 89 | 90 | 94 | 97 | 97 | 98 | 99 | 99 | 99 |
| Rfh, 5 | 87 | 88 | 89 | 93 | 95 | 96 | 96 | 96 | 97 | 97 |
| Rfh, 6 | 91 | 91 | 92 | 95 | 97 | 98 | 98 | 98 | 98 | 98 |
| Rfh, 7 | 89 | 90 | 91 | 94 | 96 | 97 | 97 | 98 | 98 | 98 |
| Rfh, 8 | 87 | 88 | 89 | 93 | 95 | 96 | 96 | 96 | 97 | 97 |
| Rfh, 9 | 89 | 90 | 91 | 94 | 97 | 97 | 97 | 98 | 98 | 98 |
| Rfh, 10 | 90 | 91 | 92 | 95 | 97 | 98 | 98 | 98 | 98 | 98 |
| Rfh, 11 | 91 | 92 | 92 | 94 | 96 | 96 | 96 | 96 | 97 | 97 |
| Rfh, 12 | 90 | 90 | 90 | 92 | 94 | 94 | 94 | 95 | 95 | 96 |
| Rfh, 13 | 89 | 89 | 90 | 92 | 94 | 94 | 95 | 95 | 96 | 96 |
| Rfh, 14 | 90 | 91 | 91 | 93 | 95 | 96 | 96 | 97 | 98 | 98 |
| Rfh, 15 | 84 | 85 | 86 | 91 | 94 | 95 | 95 | 96 | 96 | 96 |
| Rfh, 16 | 92 | 92 | 93 | 95 | 96 | 96 | 97 | 97 | 97 | 97 |
| I1/I3 | — | 23.57 | 30.17 | 6.93 | 4.69 | 4.29 | 3.92 | 3.59 | 3.31 | 3.05 |
| I2/I3 | — | 18.44 | 23.60 | 5.43 | 3.67 | 3.35 | 3.06 | 2.81 | 2.59 | 2.39 |

TABLE 6

| Wavelength | 416 nm | 417 nm | 418 nm | 419 nm | 420 nm | 421 nm | 422 nm | 423 nm | 425 nm | 430 nm |
|---|---|---|---|---|---|---|---|---|---|---|
| Overlap width | 76 | 77 | 78 | 79 | 80 | 81 | 82 | 83 | 85 | 90 |
| Rf | 97 | 97 | 97 | 97 | 97 | 97 | 96 | 96 | 96 | 95 |
| Rg | 101 | 101 | 101 | 101 | 102 | 102 | 102 | 102 | 103 | 104 |
| Rfh, 1 | 97 | 97 | 97 | 97 | 97 | 97 | 97 | 97 | 97 | 96 |
| Rfh, 2 | 97 | 97 | 97 | 96 | 96 | 96 | 96 | 96 | 95 | 94 |
| Rfh, 3 | 97 | 97 | 96 | 96 | 96 | 95 | 95 | 95 | 94 | 93 |
| Rfh, 4 | 98 | 98 | 97 | 97 | 96 | 96 | 96 | 95 | 95 | 94 |
| Rfh, 5 | 98 | 98 | 97 | 97 | 96 | 95 | 95 | 95 | 94 | 93 |
| Rfh, 6 | 98 | 98 | 97 | 97 | 97 | 97 | 96 | 96 | 95 | 94 |
| Rfh, 7 | 98 | 97 | 97 | 97 | 96 | 96 | 96 | 96 | 96 | 95 |
| Rfh, 8 | 97 | 97 | 96 | 98 | 96 | 96 | 95 | 95 | 95 | 94 |

TABLE 6-continued

| Wavelength | 416 nm | 417 nm | 418 nm | 419 nm | 420 nm | 421 nm | 422 nm | 423 nm | 425 nm | 430 nm |
|---|---|---|---|---|---|---|---|---|---|---|
| Rfh, 9 | 97 | 97 | 97 | 97 | 97 | 97 | 96 | 96 | 96 | 96 |
| Rfh, 10 | 98 | 98 | 98 | 98 | 98 | 97 | 97 | 97 | 97 | 96 |
| Rfh, 11 | 97 | 97 | 97 | 97 | 97 | 97 | 97 | 97 | 97 | 95 |
| Rfh, 12 | 96 | 97 | 97 | 97 | 98 | 98 | 98 | 98 | 97 | 95 |
| Rfh, 13 | 96 | 97 | 97 | 97 | 97 | 98 | 98 | 98 | 97 | 95 |
| Rfh, 14 | 98 | 98 | 98 | 98 | 98 | 97 | 97 | 97 | 96 | 94 |
| Rfh, 15 | 96 | 96 | 96 | 96 | 97 | 97 | 97 | 98 | 98 | 95 |
| Rfh, 16 | 97 | 98 | 98 | 98 | 98 | 98 | 97 | 97 | 97 | 95 |
| I1/I3 | 2.83 | 2.62 | 2.44 | 2.27 | 2.12 | 1.98 | 1.86 | 1.75 | 1.57 | 1.29 |
| I2/I3 | 2.21 | 2.05 | 1.91 | 1.78 | 1.66 | 1.55 | 1.46 | 1.37 | 1.23 | 1.01 |

Figure 4:
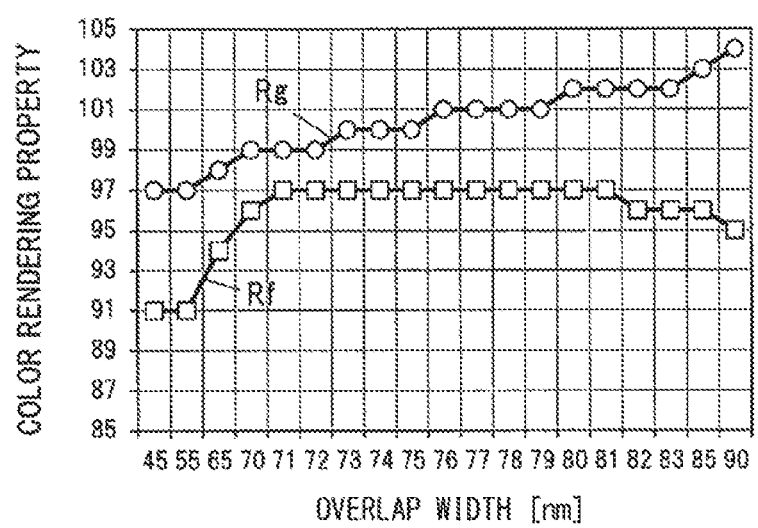
FIG. 4 is a graph chart plotting color rendering indexes Rf and Rg for mixed light shown in Tables 5, 6.

FIG. 4 is a graph chart plotting the relationship between the overlap width between the emission spectrum of the light emitting element 12 and the emission spectrum of the phosphor 15, and the color rendering indexes Rf and Rg of the mixed light. The color rendering indexes Rf, Rg of the mixed light respectively satisfy Rf≥97, and 99≤Rg≤102 while the overlap width between the emission spectrum of the emitting element 12 and the emission spectrum of the phosphor 15 is in the range of not less than 71 nm and not more than 81 nm.

The color rendering indexes Rf, Rg of the mixed light respectively satisfy Rf≥97, and 99≤Rg≤101 while the overlap width between the emission spectrum of the emitting element 12 and the emission spectrum of the phosphor 15 is in the range of not less than 71 nm and not more than 79 nm.

The color rendering indexes Rf, Rg of the mixed light respectively satisfy Rf≥97, and Rg=100 while the overlap width between the emission spectrum of the emitting element 12 and the emission spectrum of the phosphor 15 is in the range of not less than 73 nm and not more than 75 nm.

Below Tables 7, 8 show the parameters of the general color rendering index Ra, the color rendering indexes R1 to R8, the special color rendering indexes R9 to R15, the CCT, and the chromaticity coordinates Cx, Cy of the emission spectrum of the mixed light by the peak emission wavelength of the light emitting element 12.

TABLE 7

| Wavelength | N/A | 385 nm | 395 nm | 405 nm | 410 nm | 411 nm | 412 nm | 413 nm | 414 nm | 415 nm |
|---|---|---|---|---|---|---|---|---|---|---|
| Ra | 95 | 95 | 95 | 96 | 96 | 96 | 96 | 96 | 97 | 97 |
| R1 | 98 | 98 | 98 | 98 | 98 | 98 | 98 | 97 | 97 | 97 |
| R2 | 96 | 96 | 97 | 97 | 97 | 97 | 97 | 97 | 96 | 96 |
| R3 | 94 | 94 | 94 | 95 | 96 | 96 | 96 | 96 | 97 | 97 |
| R4 | 94 | 94 | 95 | 96 | 97 | 97 | 98 | 98 | 98 | 98 |
| R5 | 97 | 97 | 97 | 97 | 97 | 97 | 97 | 97 | 97 | 97 |
| R6 | 95 | 95 | 95 | 95 | 95 | 95 | 95 | 95 | 95 | 95 |
| R7 | 93 | 93 | 93 | 94 | 95 | 95 | 96 | 96 | 96 | 96 |
| R8 | 92 | 92 | 92 | 93 | 94 | 95 | 95 | 96 | 96 | 96 |
| R9 | 86 | 86 | 87 | 89 | 91 | 91 | 92 | 92 | 93 | 94 |
| R10 | 92 | 92 | 92 | 93 | 93 | 93 | 93 | 93 | 93 | 93 |
| R11 | 97 | 97 | 97 | 97 | 97 | 97 | 97 | 97 | 97 | 97 |
| R12 | 88 | 89 | 89 | 91 | 92 | 93 | 93 | 93 | 93 | 93 |
| R13 | 98 | 98 | 98 | 98 | 97 | 97 | 97 | 97 | 97 | 96 |
| R14 | 97 | 97 | 97 | 97 | 98 | 98 | 98 | 98 | 99 | 99 |
| R15 | 96 | 97 | 97 | 98 | 99 | 99 | 99 | 99 | 99 | 98 |
| CCT | 5206K | 5128K | 5231K | 5293K | 5359K | 5377K | 5397K | 5419K | 5443K | 5469K |
| Cx | 0.3399 | 0.3395 | 0.3392 | 0.3375 | 0.3357 | 0.3353 | 0.3348 | 0.3343 | 0.3337 | 0.3331 |
| Cy | 0.3526 | 0.3519 | 0.3511 | 0.3476 | 0.3441 | 0.3432 | 0.3422 | 0.3411 | 0.34 | 0.3387 |

TABLE 8

| Wavelength | 416 nm | 417 nm | 418 nm | 419 nm | 420 nm | 421 nm | 422 nm | 423 nm | 425 nm | 430 nm |
|---|---|---|---|---|---|---|---|---|---|---|
| Ra | 97 | 97 | 97 | 97 | 97 | 97 | 96 | 96 | 96 | 94 |
| R1 | 97 | 97 | 96 | 96 | 96 | 96 | 95 | 95 | 94 | 93 |
| R2 | 96 | 96 | 96 | 96 | 96 | 96 | 96 | 96 | 96 | 95 |
| R3 | 97 | 98 | 98 | 98 | 98 | 99 | 99 | 99 | 99 | 97 |
| R4 | 98 | 98 | 97 | 97 | 96 | 96 | 95 | 95 | 94 | 92 |
| R5 | 97 | 96 | 96 | 96 | 96 | 95 | 95 | 95 | 94 | 93 |
| R6 | 95 | 95 | 95 | 95 | 95 | 95 | 95 | 94 | 94 | 94 |
| R7 | 97 | 97 | 97 | 97 | 98 | 98 | 98 | 98 | 97 | 97 |
| R8 | 97 | 97 | 98 | 98 | 98 | 98 | 98 | 98 | 97 | 95 |
| R9 | 94 | 95 | 96 | 97 | 97 | 97 | 97 | 96 | 94 | 89 |
| R10 | 93 | 93 | 93 | 93 | 93 | 93 | 93 | 93 | 93 | 92 |
| R11 | 96 | 96 | 96 | 95 | 95 | 94 | 94 | 93 | 92 | 90 |
| R12 | 92 | 92 | 92 | 91 | 91 | 90 | 90 | 89 | 89 | 89 |
| R13 | 96 | 96 | 96 | 96 | 95 | 95 | 95 | 95 | 94 | 93 |
| R14 | 99 | 99 | 99 | 99 | 99 | 99 | 99 | 99 | 99 | 98 |
| R15 | 98 | 98 | 97 | 97 | 96 | 96 | 95 | 95 | 94 | 91 |
| CCT | 5497K | 5528K | 5561K | 5596K | 5634K | 5674K | 5716K | 5769K | 5850K | 6082K |

TABLE 8-continued

| Wavelength | 416 nm | 417 nm | 418 nm | 419 nm | 420 nm | 421 nm | 422 nm | 423 nm | 425 nm | 430 nm |
|---|---|---|---|---|---|---|---|---|---|---|
| Cx | 0.3325 | 0.3318 | 0.3311 | 0.3303 | 0.3296 | 0.3288 | 0.3279 | 0.3271 | 0.3255 | 0.3217 |
| Cy | 0.3374 | 0.336 | 0.3346 | 0.3331 | 0.3315 | 0.3299 | 0.3283 | 0.3267 | 0.3235 | 0.3162 |

Meanwhile, the emission spectrum of the light emitted from the light emitting element 12 shifts so as to change the overlap width between the emission spectrum of the light emitting element 12 and the emission spectrum of the phosphor 15 in this example. The relationship between the overlap width between the emission spectrum of the light emitting element 12 and the emission spectrum of the phosphor 15, and the color rendering index of the light emitted from the light emitting device 1 is same while the peak emission wavelength of the light emitted from the light emitting element 12 is in the wavelength range of not less than 411 nm and not more than 421 nm even if the emission spectrum of the phosphor 15 shifts or both the emission spectrum of the light emitting element 12 and the emission spectrum of the phosphor 15 shift.

That is, while the peak emission wavelength of the light emitted from the light emitting element 12 is in the wavelength range of not less than 411 nm and not more than 421 nm, the overlap width is desirably not less than 71 nm and not more than 81 nm, more desirably not less than 71 nm and not more than 79 nm, and furthermore desirably not less than 73 nm and not more than 75 nm so as to increase the color rendering indexes Rf, Rg without depending on the emission wavelength of the light emitted from the light emitting element 12 or the emission wavelength of the fluorescence emitted from the phosphor 15.

Although the embodiments have been described, the invention is not intended to be limited to the embodiments. The various kinds of modifications can be implemented without departing from the gist of the invention.

Also, the claimed invention is not intended to be limited to the embodiments. Further, it should be noted that all combinations of the features described in the embodiments and the examples are not necessary to solve the problems of the invention.

What is claimed is:

1. A light emitting device, comprising:
a light emitting element that emits a light having a peak wavelength of not less than 411 nm and not more than 421 nm; and
a phosphor that emits a fluorescence having a longer peak wavelength than the peak wavelength of the light emitted from the light emitting element,
wherein an emission spectrum of only the light emitting element and an emission spectrum of only the phosphor overlap each other while having an overlap width of not less than 71 nm and not more than 81 nm, and
wherein the overlap width is defined as a wavelength difference between a long wavelength side point at a 0.1% height of a peak height of the emission spectrum of only the light emitting element and a short wavelength side point at a 0.1% height of a highest peak of the emission spectrum of only the phosphor.

2. The light emitting device according to claim 1, wherein the overlap width is not less than 71 nm and not more than 79 nm.

3. The light emitting device according to claim 1, wherein the overlap width is not less than 73 nm and not more than 75 nm.

4. The light emitting device according to claim 1, wherein the light emitting device emits a light satisfying Rf≥90 and 95≤Rg≤105, where Rf and Rg are color rendering indexes when a reference light is defined as a light with a color temperature of not less than 5000K and not more than 6500K.

5. The light emitting device according to claim 1, wherein the phosphor comprises a first phosphor emitting a fluorescence having a peak emission wavelength of not less than 445 nm and not more than 490 nm, a second phosphor emitting a fluorescence having a peak emission wavelength of not less than 491 nm and not more than 600 nm, and a third phosphor emitting a fluorescence having a peak emission wavelength of not less than 601 nm and not more than 670 nm.

6. The light emitting device according to claim 2, wherein the phosphor comprises a first phosphor emitting a fluorescence having a peak emission wavelength of not less than 445 nm and not more than 490 nm, a second phosphor emitting a fluorescence having a peak emission wavelength of not less than 491 nm and not more than 600 nm, and a third phosphor emitting a fluorescence having a peak emission wavelength of not less than 601 nm and not more than 670 nm.

7. The light emitting device according to claim 3, wherein the phosphor comprises a first phosphor emitting a fluorescence having a peak emission wavelength of not less than 445 nm and not more than 490 nm, a second phosphor emitting a fluorescence having a peak emission wavelength of not less than 491 nm and not more than 600 nm, and a third phosphor emitting a fluorescence having a peak emission wavelength of not less than 601 nm and not more than 670 nm.

8. The light emitting device according to claim 4, wherein the phosphor comprises a first phosphor emitting a fluorescence having a peak emission wavelength of not less than 445 nm and not more than 490 nm, a second phosphor emitting a fluorescence having a peak emission wavelength of not less than 491 nm and not more than 600 nm, and a third phosphor emitting a fluorescence having a peak emission wavelength of not less than 601 nm and not more than 670 nm.

9. The light emitting device according to claim 5, wherein the first phosphor comprises two types of alkaline earth halophosphate phosphors,
wherein the second phosphor comprises a β-SiAlON phosphor and a Ca solid solution α-SiAlON phosphor, and
wherein the third phosphor comprises a CASON phosphor and a CASN phosphor.

10. The light emitting device according to claim 6, wherein the first phosphor comprises two types of alkaline earth halophosphate phosphors,
wherein the second phosphor comprises a β-SiAlON phosphor and a Ca solid solution α-SiAlON phosphor, and
wherein the third phosphor comprises a CASON phosphor and a CASN phosphor.

11. The light emitting device according to claim 7, wherein the first phosphor comprises two types of alkaline earth halophosphate phosphors,
   wherein the second phosphor comprises a β-SiAlON phosphor and a Ca solid solution α-SiAlON phosphor, and
   wherein the third phosphor comprises a CASON phosphor and a CASN phosphor.

12. The light emitting device according to claim 8, wherein the first phosphor comprises two types of alkaline earth halophosphate phosphors,
   wherein the second phosphor comprises a β-SiAlON phosphor and a Ca solid solution α-SiAlON phosphor, and
   wherein the third phosphor comprises a CASON phosphor and a CASN phosphor.

* * * * *